(12) United States Patent
You et al.

(10) Patent No.: US 10,707,436 B2
(45) Date of Patent: Jul. 7, 2020

(54) ILLUMINATION DEVICE

(71) Applicant: LG Display Co., Ltd., Seoul (KR)

(72) Inventors: Jin-A You, Daejeon (KR); Chang-Oh Kim, Paju-si (KR); Jae-Min Moon, Seoul (KR); Ju-Hyuk Kwon, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/209,748

(22) Filed: Dec. 4, 2018

(65) Prior Publication Data

US 2019/0181369 A1 Jun. 13, 2019

(30) Foreign Application Priority Data

Dec. 12, 2017 (KR) .................. 10-2017-0170307

(51) Int. Cl.
*H01L 51/50* (2006.01)
*H01L 51/52* (2006.01)

(52) U.S. Cl.
CPC ........ *H01L 51/504* (2013.01); *H01L 51/5278* (2013.01)

(58) Field of Classification Search
CPC .................... H01L 51/504; H01L 51/5278
See application file for complete search history.

(56) References Cited

U.S. PATENT DOCUMENTS

| | | | | |
|---|---|---|---|---|
| 2013/0069077 A1* | 3/2013 | Song | ............... | H01L 51/5278 257/76 |
| 2013/0119357 A1* | 5/2013 | Kim | ............... | H01L 51/5048 257/40 |
| 2013/0146850 A1* | 6/2013 | Pieh | ............... | H01L 51/5203 257/40 |
| 2013/0320837 A1* | 12/2013 | Weaver | ............... | H05B 33/14 313/504 |

* cited by examiner

*Primary Examiner* — Errol V Fernandes
(74) *Attorney, Agent, or Firm* — Fenwick & West LLP

(57) ABSTRACT

The present disclosure relates to an illumination device which is realized by an organic light emitting element having a plurality of stacks and which achieves an improvement in relation to the efficiency difference among wavelengths by changing a light emitting layer structure of a predetermined stack.

6 Claims, 12 Drawing Sheets

ILLUMINATION DEVICE

CROSS-REFERENCE TO RELATED APPLICATIONS

This application claims priority to Republic of Korea Patent Application No. 10-2017-0170307, filed on Dec. 12, 2017, which is hereby incorporated by reference in its entirety.

BACKGROUND OF THE TECHNOLOGY

Field of the Disclosure

The present disclosure relates to an illumination device, and more particularly to an illumination device capable of improving changes in color temperature regardless of change in current density using an organic light emitting element.

Discussion of the Related Art

Lighting used in household appliances has recently changed from incandescent lamps and fluorescent lamps to low-voltage LED devices having a long service life.

However, LED devices, which use an inorganic semiconductor as a light emitting source, require a lens for sufficient efficiency and require a light emitting package for storing the inorganic semiconductor to be arranged at a lower part, which makes it impossible to make the device slim.

Accordingly, studies are underway to realize illumination devices using other light sources in addition to LED devices.

An illumination device using an organic light emitting element is easily formed on a typical substrate as large-area coating thereof is possible. Particularly, the illumination device can be formed on a plastic substrate having flexibility, which is recently considered. In addition, the illumination device using an organic light emitting element is advantageous in that it may obtain high luminous efficacy and achieve low-voltage driving, a high response speed and a lightweight design.

For this reason, illumination devices using organic light emitting elements are being researched. However, for a white illumination device using a plurality of light emitting layers to implement white light, there is an issue of a difference in efficiency between different light emitting layers. Particularly, a difference in efficiency occurs among wavelengths according to time and change in current density during driving.

SUMMARY

Accordingly, the present disclosure is directed to an illumination device that substantially obviates one or more problems due to limitations and disadvantages of the related art.

An object of the present disclosure is to provide a white illumination device capable of obtaining an improvement related to a difference in efficiency among wavelengths according to a change in current density by changing a stack structure of an organic light emitting element.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, an illumination device includes an organic light emitting element having a plurality of stacks, wherein the structure of light emitting layers of a predetermined stack is changed to achieve an improvement in relation to an difference in efficiency among wavelengths according to a change in current density.

In one aspect of the present disclosure, an illumination device has first and second electrodes disposed opposite each other, and an organic stack filling a gap between the first electrode and the second electrode, wherein the organic stack includes a first stack disposed between the first electrode and the second electrode and having a first light emitting layer including a first dopant having a peak wavelength between 420 nm and 470 nm as an emitter, a second stack disposed between the first stack and the second electrode and having a second light emitting layer including, as emitters, a second dopant having a peak wavelength of 500 nm to 590 nm and a third dopant having a peak wavelength greater than the peak wavelength of the second dopant by 60 nm to 100 nm, and a first charge generation layer disposed between the first stack and the second stack.

The second stack may further include a third light emitting layer contacting the second light emitting layer, the third light emitting layer having only a fourth dopant having a peak wavelength of 500 nm to 590 nm as an emitter.

In addition, a ratio of the first dopant to a host may be between 2 to 10% by weight in the first light emitting layer.

A ratio of the second dopant to a host may be between 4 to 15% by weight in the second light emitting layer, wherein the ratio of the third dopant to a host may be between 0.1 to 2.0% by weight in the second light emitting layer.

A ratio of the fourth dopant to a host may be between 4 to 15% by weight in the third light emitting layer.

The organic stack may further include a third stack disposed between the first electrode and the first stack and separated from the first stack by a second charge generation layer interposed therebetween, the third stack including a fourth light emitting layer identical to the second light emitting layer.

The third stack may further include a fifth light emitting layer contacting the fourth light emitting layer and having only a fourth dopant having a peak wavelength of 500 nm to 590 nm as an emitter.

The fourth dopant may be the same as the second dopant.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

DETAILED DESCRIPTION OF THE DISCLOSURE

Figure 1:
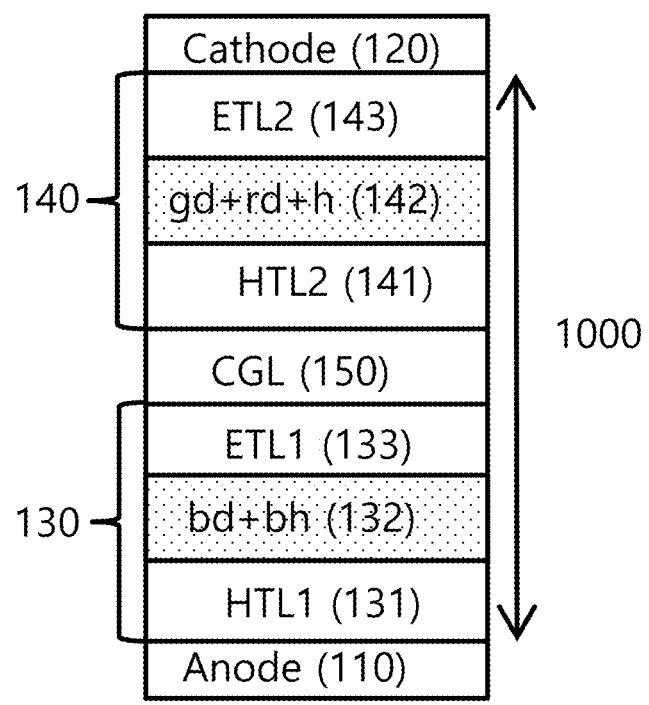
FIG. 1 is a cross-sectional view showing an illumination device according to a first embodiment of the present disclosure.

Reference will now be made in detail to the preferred embodiments of the present disclosure, examples of which are illustrated in the accompanying drawings. Wherever possible, the same reference numbers will be used throughout the drawings to refer to the same or like parts. In the following description, a detailed description of well-known technologies or configurations will be omitted when it is determined that the subject matter of the present disclosure may be unnecessarily obscured. In addition, the names of parts used in the following description are selected to simply facilitate preparation of this specification, and may be different from the part names of an actual product.

The shapes, sizes, ratios, angles, numbers and the like disclosed in the drawings to describe embodiments of the present disclosure are merely exemplary and the present disclosure is not limited thereto. Like reference numerals refer to like elements throughout the specification. In the following description of the present disclosure, a detailed description of known related art will be omitted when it is determined that the subject matter of the present disclosure may be unnecessarily obscured. As used herein, the terms "comprise", "having," "including" and the like suggest that other parts can be added unless the term "only" is used. As used herein, the singular forms "a", "an", and "the" are intended to include the plural forms as well, unless context clearly indicates otherwise.

It is to be understood that when an element or a layer is described as being "on" another element or layer, it may be "directly on" another element or may be "indirectly" arranged such that another intervening layer or element is present between the two elements or layers. On the other hand, it is to be understood that when an element or a layer is described as "contacting" another element, this means that no other element or layer is interposed therebetween.

As used herein, the term "doped" means that a material having a different physical property from a material that occupies most of the weight ratio of a certain layer is added at a weight ratio of less than 15% to the material that occupies most of the weight ratio (wherein different physical properties include, for example, N-type and P-type, and an organic material and an inorganic material). In other words, a "doped" layer means a layer in which a host material and a dopant material can be distinguished from each other in consideration of weight proportions thereof. "Undoped" refers to all cases other than the case corresponding to "doped". For example, if a layer is composed of a single material or a mixture of materials having the same or similar properties, the layer is included in the "undoped" layer. For example, if at least one of the materials that make up a layer is P-type and any of the materials that make up the layer is not N-type, that layer is included in the "undoped" layer. For example, if at least one of the materials that make up a layer is an organic material, and all the materials that make up the layer are not inorganic, the layer is included in the "undoped" layer. For example, if the materials that make up a layer are all organic materials, at least one of the materials that make up the layer is N-type and at least one other is P-type, the layer is included in the "doped" layer when the N-type material has a weight ratio below 10% or the P-type material has a weight ratio below 10%.

As used herein, the term "stack" refers to a unit structure including a hole transport layer, an organic layer including a hole transport layer, and an organic light emitting layer disposed between the hole transport layer and the electron transport layer. The organic layer may further include a hole injection layer, an electron blocking layer, a hole blocking layer, and an electron injection layer. Other organic layers may be further included depending on the structure and design of the organic light emitting element.

Hereinafter, preferred embodiments according to the present disclosure will be described with reference to the drawings.

FIG. 1 is a cross-sectional view showing an illumination device according to a first embodiment of the present disclosure.

As shown in FIG. 1, an illumination device according to a first embodiment of the present disclosure includes a first electrode (Cathode) 110 and a second electrode (Anode) 120 disposed opposite each other, and an organic stack 1000 formed of an organic material and filling a gap between the first electrode 110 and the second electrode 120. That is, the illumination device of the present disclosure uses an organic light emitting element unlike an LED, which uses a currently preferred inorganic light emitting element as a light emitting source. With the organic light emitting element, configuration of a light emitting package can be omitted, and thus a slim design and flexibility may be obtained.

The organic stack 1000 includes a first stack 130, a second stack 140, and a charge generation layer (CGL) 150, which are arranged between the first electrode 110 and the second electrode 120. The first stack 130 has a first light emitting layer 132 including a first dopant bd having a peak wavelength between 420 nm and 470 nm as an emitter. The second stack 140 is arranged between the first stack 130 and the second electrode 120, and has a second light emitting layer 142 including, as emitters, a second dopant gd having a peak wavelength of 500 nm to 590 nm and a third dopant rd having a peak wavelength that is greater than the peak wavelength of the second dopant gd by 60 nm to 100 nm. The charge generation layer 150 is arranged between the first stack 130 and the second stack 140.

The first stack 130 and the second stack 140 of the organic stack 1000 of the present disclosure are separated by at least the charge generation layer 150. The light emitting layers 132 and 142 of the respective stacks 130 and 140 do not contact each other. Accordingly, the light emitting layers 132 and 142 of the respective stacks 130 and 140 are independently provided.

Each of the first and second stacks 130 and 140 may further include a hole transport layer (HTL1) 131 and a hole transport layer (HTL2) 141, which is under the light emitting layer (bd+bh) 132, light emitting layer (gd+rd+h) 142, an electron transport layer (ETL1) 133, and an electron transport layer (ETL2) 143, which is on the light emitting layer 132 (bd+bh) and light emitting layer (gd+rd+h) 142.

Each of the first and second stacks 130 and 140 may further include a hole injection layer arranged on the lower side of the hole transport layer 131, 141 and having a HOMO level different from that of the work function of the first electrode 110 by 2 eV or less, and an electron injection layer arranged on the upper side of the electron transport layer 133, 143 and containing an alkali metal or an alkaline earth metal as a dopant. In an embodiment, the hole injection layer may further include a p-type dopant.

The layers 133, 143, 131, 141 provided on and under each of the light emitting layers 132 and 142 function to transport electrons and holes to the light emitting layers 132 and 142, respectively.

In each of the light emitting layers 132 and 142, the emitter is a dopant determining the wavelength range of emitted light. The light emitting layers 132 and 142 contain a host as a main component in addition to the dopant. The host has an energy band gap overlapping that of the dopant, and the excitation energy of the host is transferred to the dopant, thereby causing light emission from the dopant having high external quantum efficiency. At this time, high light emission efficiency is obtained when the emission spectrum of the host overlaps the absorption spectrum of the dopant of the corresponding light emitting layer as much as possible.

A ratio of the first dopant bd to the host may be between 2 to 10% by weight in the first light emitting layer 132. The first stack 130 having the first light emitting layer 132, which emits blue light, is separated from the second stack 140, which emits green and red light. This is because the emission efficiency of blue light is relatively low in a visible light wavelength range. Further, when a plurality of light emitting dopants is mixed, the energy is transferred to the light emitting dopant of another color having high efficiency, and thus blue light is not sufficiently emitted even if the content of the blue dopant is increased. Particularly, an example of the blue dopant which ensures a sufficiently long service life to be applied to an illumination device is a pyrene derivative, which is a fluorescent dopant. When a blue fluorescent dopant of the pyrene derivative and a phosphorescent dopant emitting light of another color are mixed in a light emitting layer, the emission efficiency of blue light is very low. Accordingly, in order to obtain a sufficient efficiency of blue light in white light with the white illumination device of the present disclosure, the first stack 130 having the first light emitting layer 132 for emission of blue light is configured independently of the second stack 140 having the second light emitting layer 142 for emission of a longer wavelength. In light, white is realized by adding blue, green, and red. To achieve white light, blue emission efficiency higher than or equal to a certain level is required.

The second light emitting layer 142 of the second stack 140 includes a second dopant gd having a peak wavelength of 500 nm to 590 nm and a third dopant rd having a peak wavelength greater than the peak wavelength of the second dopant gd by 60 nm to 100 nm in addition to the one or more hosts h. A ratio of the second dopant gd to the host may be between 4 to 15% by weight in the second light emitting layer 142 and a ratio of the third dopant rd to the host may be between 0.1 to 2.0% by weight in the second light emitting layer 142. The content of the third dopant (rd) which emits relatively red light is set to be lower than the content of the second dopant (gd) which emits green light in order to increase the emission efficiency of green light, which is a main factor of the efficiency of white light emission. The band gap of the second dopant gd may be larger than the band gap of the third dopant rd. In this case, excitons are produced in the second light emitting layer 142 by recombination of holes and electrons in the second dopant gd. Thereby, the excitons emit green light as the energy thereof falls to the ground state. Thereafter, the remaining electrons and holes are secondarily recombined in the third dopant rd to produce excitons, which emit red light as the energy thereof falls to the ground state.

Here, both the second and third dopants gd and rd are iridium (Ir) derivatives, and have different emission wavelengths depending on the difference between the iridium-bonded organic material and a substituent thereof.

The second and third dopants gd and rd for emission of green light and red light are included in the same second light emitting layer 142 because the emission efficiency of green and red can be maintained constant without concentration quenching. In the illumination device, current density is adjusted as necessary to realize white light. In the case where a separate green light emitting layer and a separate red light emitting layer contacting the green light emitting layer are provided, when the current density is increased, the holes and electrons included in the green light emitting layer are transferred to the red light emitting layer, thereby lowering the hole-electron recombination efficiency in the green light emitting layer and producing a difference in color temperature. To prevent this phenomenon, the illumination device of the present disclosure uses the second and third dopants gd and rd together in the second light emitting layer 142.

That is, in the organic stack 1000 provided between the first and second electrodes 110 and 120 in the illumination device of the present disclosure, the first light emitting layer 132 for emission of blue light that has low efficiency and an energy band gap different from the energy band gap of the emitters of other colors is provided in the independent first stack 130, and the emitters (dopants) for green and red light between which the difference in energy band gap is less than or equal to 0.5 eV is provided in the same second light emitting layer 142 of the second stack 140 through co-deposition. Accordingly, the color temperature may be kept constant regardless of change in the current density in the long wavelength region. For example, in the illumination device of the present disclosure, the band gap (HOMO-LUMO difference) of the red dopant is 2.0 eV, and the band gap (HOMO-LUMO difference) of the green dopant is 2.3 eV.

The first electrode 110 may be disposed in contact with the substrate (not shown), and thus the illumination device may be formed in the order of the stacks shown in FIG. 1. In an embodiment, the second electrode 120 may be formed in contact with the substrate. In this case, the stack structure of FIG. 1 may be inverted and formed on the substrate as a reverse structure. This configuration is also applied to the illumination device according to a second embodiment described below.

Figure 2:
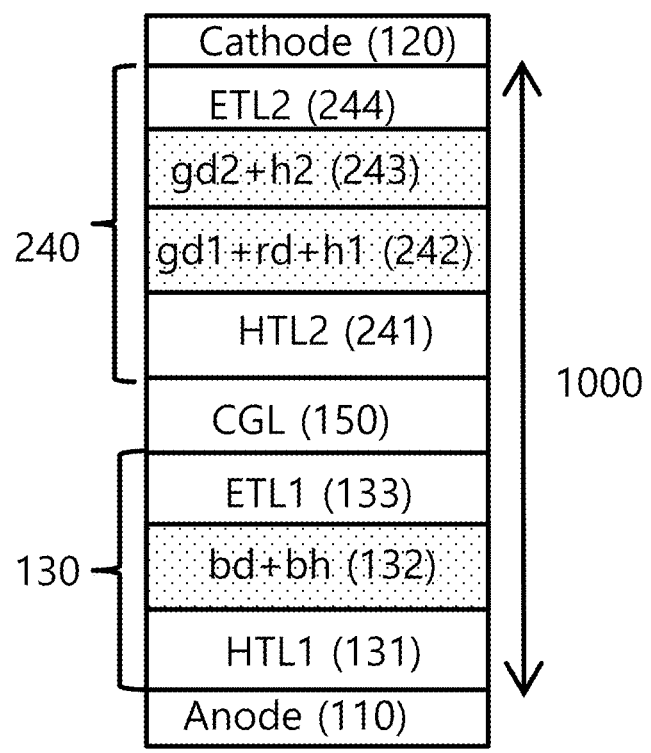
FIG. 2 is a cross-sectional view showing an illumination device according to a second embodiment of the present disclosure.

FIG. 2 is a cross-sectional view showing an illumination device according to a second embodiment of the present disclosure.

As shown in FIG. 2, compared to the first embodiment described above, the white light illumination device according to the second embodiment of the present disclosure further includes a third light emitting layer (gd2+h2) 243 contacting a second light emitting layer (gd1+rd+h1) 242 in a second stack 240 and including only a fourth dopant gd2, having the same range of the green peak wavelength as that of the second dopant gd1, as an emitter. In this case, a hole transport layer (HTL2) 241 and an electron transport layer (ETL2) 244 are arranged under and on the second and third light emitting layers 242 and 243 in the second stack 240, as in the first embodiment. A second dopant gd1 and the fourth dopant gd2 emit the same or similar green peak wavelength. A ratio of the fourth dopant gd2 to the host may be between 4 to 15% by weight in the third light emitting layer 243. As the third light emitting layer 243 is further included, the color gamut may be enhanced for the green wavelength. In either case, the second and fourth dopants gd1 and gd2 have a higher content by weight than the third dopant rd. Accordingly, energy may be transferred to the red dopant after green light is sufficiently emitted.

This color gamut may be explained in connection with "color rendering," which indicates the ability of a light source to reveal the colors of various objects faithfully in comparison with an ideal or natural light source.

"Color rendering index (CRI)" for color rendering, which is 100 when an object is seen in daylight, is assigned to the object when the object is seen under an illumination device in comparison with the CRI of the object seen in daylight. When a color similar to the color of an object seen in daylight is reproduced, the CRI is close to 100. With the white illumination device of the present disclosure, a CRI greater than or equal to 83 is obtained. In particular, when the third light emitting layer 243 is further provided as in the second embodiment, the CRI is increased to 92, which means that color gamut is further enhanced.

Even if the second dopant gd1 for emission of green light and the third dopant rd for emission of red light are provided together in the second light emitting layer 242 with the third dopant rd having a lower content, the third light emitting layer 243 is provided to enhance color rendering of the green wavelength range to enhance emission of green light because energy will be transferred to the third dopant rd. In the third light emitting layer 243 has the fourth dopant gd2 for only emission of green light.

The order in which the second light emitting layer 242 and the third light emitting layer 243 are provided may be changed. Thus, the third light emitting layer 243 may be provided below the second light emitting layer 242.

Here, the third light emitting layer 243 for emitting green light is further provided to implement white light to increase the emission efficiency of green over the emission efficiency of red and blue. In this case, white emission efficiency is increased at the same applied current because visibility of green is improved.

Figure 3:
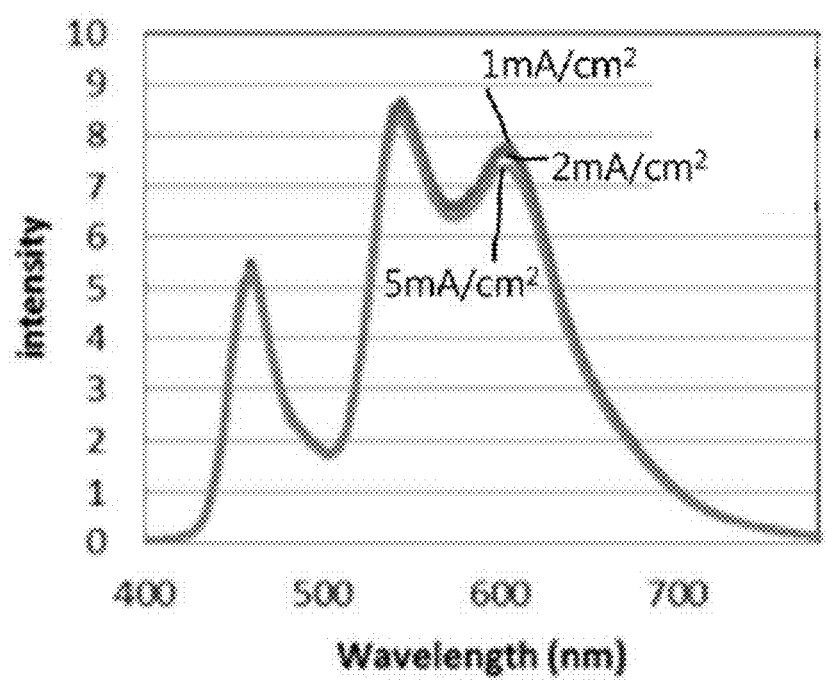
FIG. 3 is a graph depicting intensities with respect to wavelengths of an emission spectrum of the illumination device of the present disclosure according to FIGS. 1 and 2.
Figure 4:
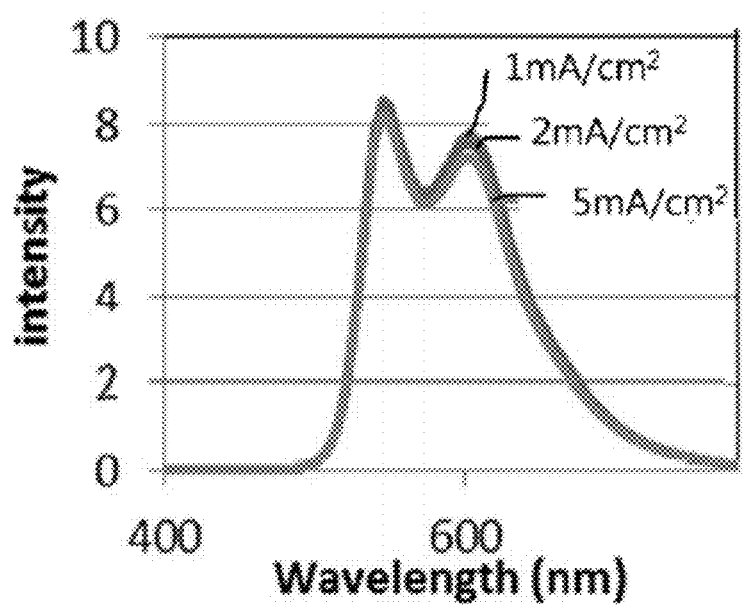
FIG. 4 is a graph depicting intensities with respect to wavelengths of an emission spectrum in a structure having only a second stack between first and second electrodes in the illumination device of the present disclosure.

FIG. 3 is a graph depicting intensities with respect to wavelengths of an emission spectrum of the illumination device of the present disclosure according to FIGS. 1 and 2, and FIG. 4 is a graph depicting intensities with respect to wavelengths of an emission spectrum in a structure having only a second stack between first and second electrodes in the illumination device of the present disclosure. The first embodiment and the second embodiment of the present disclosure yielded equivalent levels of intensity with respect to wavelength.

When the illumination devices according to the first and second embodiments of the present disclosure have the two stacks 130 and 140/240 in common, three peaks are obtained in a visible light wavelength range of 420 nm to 650 nm. In addition, as shown in FIGS. 3 and 4, when the current density is increased from 1 $mA/cm^2$ to 5 $mA/cm^2$, the illumination devices exhibit the same tendency and the same curve as peak wavelengths appear in the ranges of 450 nm to 470 nm, 540 nm to 570 nm, and 610 nm to 620 nm. Since the first light emitting layer for emitting blue light is independently provided in the first stack, the blue light has the same characteristics regardless of current density. In addition, since there is no concentration quenching in the second layer, which emits green and red light together, the blue light has the same curve even if the current density is increased. This means that color balance is constant regardless of current density.

The graphs of FIGS. 3 and 4 are obtained by stacking the elements of the illumination device according to the first embodiment of the present disclosure in the following order.

As shown in FIG. 1, the first electrode 110 is formed on a substrate using a transparent electrode of ITO (Indium Tin Oxide). Subsequently, HATCN is applied to form the hole injection layer (not shown) with a thickness of 300 Å, and then NPD is applied for the first hole transport layer 131 with a thickness of 300 Å.

Subsequently, the first light emitting layer 132 is formed on the first hole transport layer 131 by doping a pyrene derivative which is a blue dopant bd with a content of 5% by weight in an anthracene derivative bh with a thickness of 300 Å.

Subsequently, Alq3 is applied to form the first electron transport layer 133 with a thickness of 250 Å on the first light emitting layer 132. Thereby, the first stack 130 is completed.

Next, Li is doped with a content of 2% by weight in a phenanthroline derivative with a thickness of 100 Å to form the charge generation layer 150.

Subsequently, HATCN with a thickness of 300 Å is deposited on the entire surface to form the second hole transport layer 141 of the second stack 140.

Subsequently, the second light emitting layer 142 with a thickness of 300 Å is formed by doping an Ir derivative with a content of 10% by weight as a green dopant gd and an Ir derivative having a different substituent from the green dopant gd as a red dopant rd in an anthracene derivative used as the host h.

Subsequently, a 1:1 mixture of Alq3 and LiQ is deposited on the second light emitting layer 142 to form the second electron transport layer 143 with a thickness of 350 Å. Thereby, the second stack 140 is completed.

Next, Al is deposited to form the second electrode 120 with a thickness of 1000 Å.

The illumination device according to the second embodiment of FIG. 2 is different from that of the first embodiment in that the second stack 240 includes two light emitting layers: the second light emitting layer 242 and the third light emitting layer 243. The graphs of FIGS. 3 and 4 may also be obtained through the configuration of the second embodiment of FIG. 2.

While the other constituents are the same as those of the first embodiment, the second light emitting layer 242 is formed to a thickness of 50 Å by doping an Ir derivative with a content of 10% by weight as a first green dopant gd1 and an Ir derivative having a different substituent from the first green dopant gd1 as the red dopant rd with a content of 0.3% by weight in an anthracene derivative used as a host h1. Subsequently, the third light emitting layer 243 is formed by doping an Ir derivative with a content of 10% by weight as a second green dopant gd2 in the host h2 of an anthracene derivative.

Here, the first and second green dopants gd1 and gd2 may be the same Ir derivative or Ir derivatives having a difference in light emission peak of 30 nm or less. Even if the first and second green dopants gd1 and gd2 are the same, green light may be emitted in substantially different wavelength ranges due to a difference in absorption spectra between the hosts h1 and h2.

Hereinafter, the illumination device of the present disclosure described above and organic light emitting element of a comparative example provided with a red light emitting layer 42 and a green light emitting layer 43, shown in FIG. 5A, arranged to contact each other will be compared.

Figure 5A:
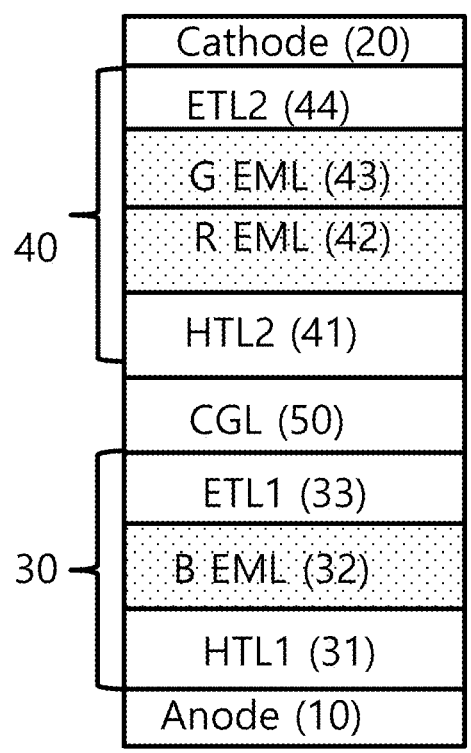
FIG. 5A is a cross-sectional view illustrating a white organic light emitting element according to a comparative example.
Figure 5B:
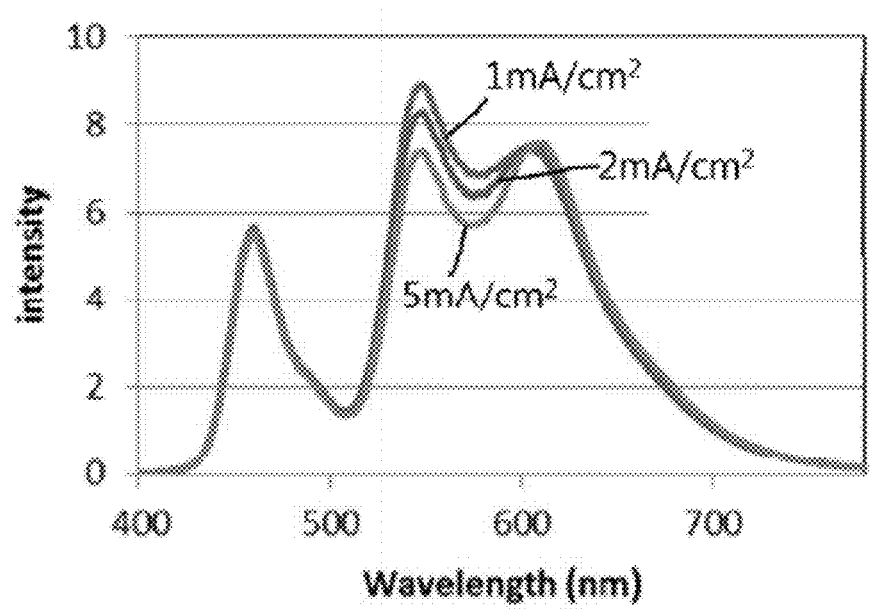
FIG. 5B is a graph depicting intensities with respect to wavelengths of the emission spectrum of the comparative example of FIG. 5A.
Figure 5C:
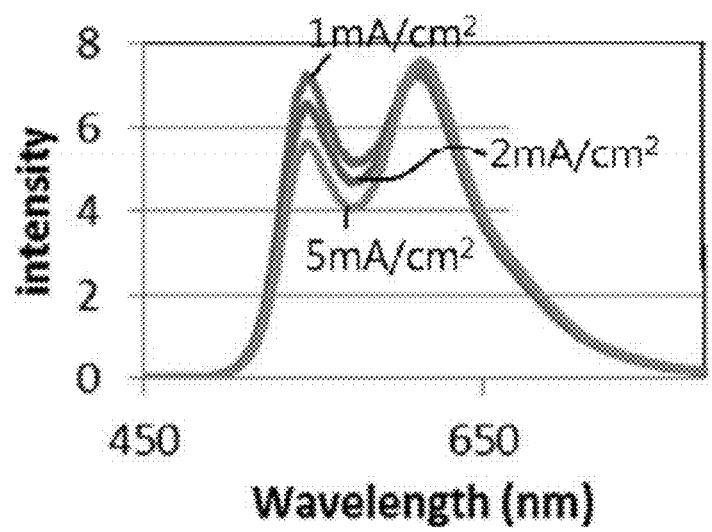
FIG. 5C is a graph depicting intensities with respect to wavelengths of the emission spectrum of the second stack of FIG. 5A.

FIG. 5A is a cross-sectional view illustrating an organic light emitting element according to a comparative example. FIG. 5B is a graph depicting intensities with respect to wavelengths of the emission spectrum of a device with the configuration of FIG. 5A. FIG. 5C is a graph depicting intensities with respect to wavelengths of the emission spectrum of the second stack of FIG. 5A.

As shown in FIG. 5A, the organic light emitting element according to the comparative example has a first stack 30 and a second stack 40, which are formed between a first electrode (Anode) 10 and a second electrode (Cathode) 20, and a charge generation layer (CGL) 50 is arranged between the first stack 30 and the second stack 40. The first stack 30 has a blue light emitting layer (B EML) 32, and the second stack 40 has a red light emitting layer (R EML) 42 and a green light emitting layer (G EML) 43, which contact each other. In addition, each of the first stack 30 and the second stack 40 has a hole transport layer (HTL1) 31 and a hole transport layer (HTL2) 41 under the respective light emitting layers 32, 42 and 43 and an electron transport layer (ETL1) 33 and an electron transport layer (ETL2) 44 on the respective light emitting layers 32, 42 and 43.

The organic light emitting element of the comparative example differs in an experiment described below differs from the illumination devices according to the first and second embodiments only in the light emitting layers configured in the second stack 40, while having the same configuration of the first stack 30 as those of the first and second embodiments of the present disclosure.

That is, in the second stack 40 of the comparative example, the red light emitting layer 42 was formed to have a thickness of 50 Å by doping a red dopant of an Ir derivative with a content of 2% by weight in an anthracene derivative used as a host, and then the green light emitting layer 43 was formed to have a thickness of 250 Å by doping a green dopant of an Ir derivative with a content of 10% by weight in an anthracene derivative used as a host.

In this case, as shown in FIGS. 5A and 5B, when the current density is increased from 1 mA/cm$^2$ to 5 mA/cm$^2$, almost the same tendency to exhibit peak wavelengths in the ranges of 450 nm to 470 nm, 540 nm to 570 nm, and 610 nm to 620 nm is observed. In particular, the green intensity curve falls as the current density increases. Here, since the blue light emitting layer for emitting blue light is provided independently in the first stack, blue light exhibits the same light emission property regardless of current density. However, in the comparative example, the emission efficiency of the green light emitting layer is gradually lowered because the carriers such as electrons or excitons in the green light emitting layer are moved over to the red light emitting layer for emitting red light. Such change in the emission efficiency of the green light emitting layer occurs according to change in the current density, which is a limitation of the comparative example.

In contrast, for the illumination device of the present disclosure, a red light emitting dopant and a green light emitting dopant, which have similar bandgaps, are provided in one light emitting layer, and a host h1 having an emission spectrum overlapping the absorption spectra of the red light emitting dopant and the green light emitting dopant is applied to the second light emitting layer 242, 142. Thus, although different light emitting dopants are used in the second light emitting layer, they transfer energy to each other. Accordingly, almost the same curve is obtained without concentration quenching even when the current density increases. The characteristic of having the same curve of emission intensity with respect to the wavelength regardless of change in the current density is obtained in the first and second embodiments of the present disclosure in common.

Figure 6:
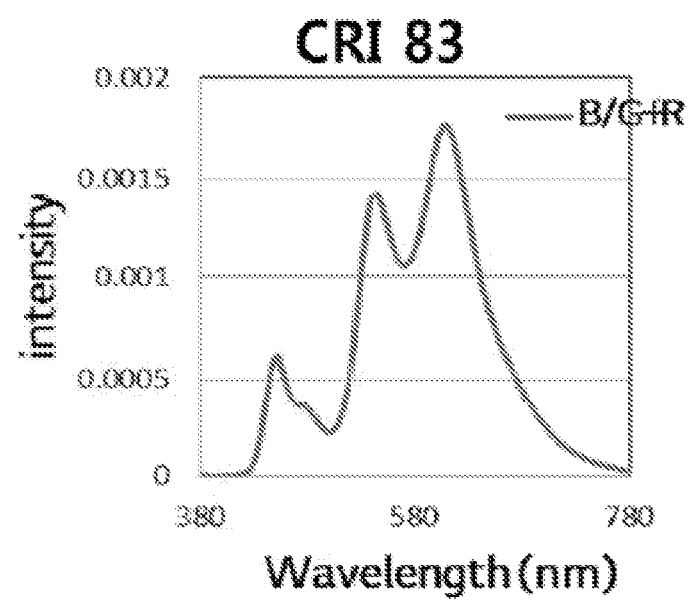
FIG. 6 is a graph depicting color rendering of the illumination device according to the first embodiment of the present disclosure.

FIG. 6 is a graph depicting color rendering of the illumination device according to the first embodiment of the present disclosure.

As shown in FIG. 6, the color rendering index (CRI) of the illumination device according to the first embodiment is 83, which is superior to the halogen lamp.

Figure 7:
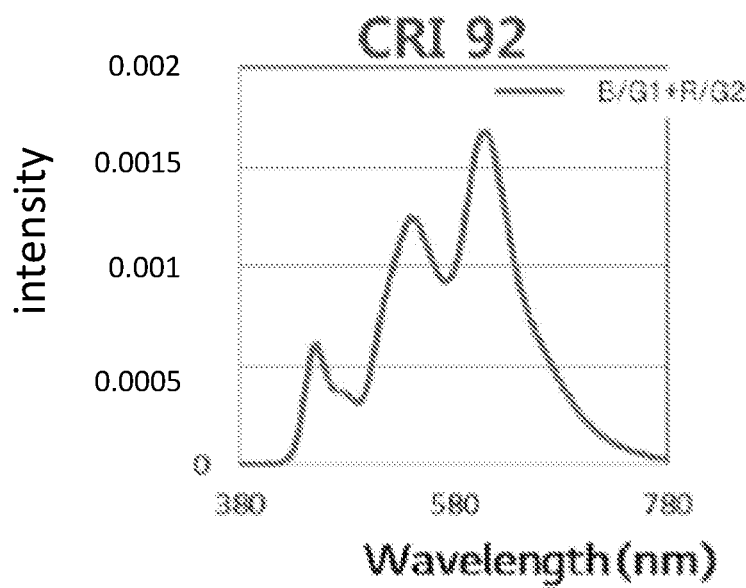
FIG. 7 is a graph depicting color rendering of the illumination device according to the second embodiment of the present disclosure.

FIG. 7 is a graph depicting color rendering of the illumination device according to the second embodiment of the present disclosure.

As shown in FIG. 7, the illumination device according to the second embodiment of the present disclosure has a wider emission spectrum at the green wavelength than in FIG. 6. In this embodiment, the CRI is 92, which means that color close to the color in daylight can be reproduced. That is, when a third light emitting layer having a light emitting dopant for emitting only green light is arranged in contact with the second light emitting layer including red and green light emitting dopants, color rendering may be improved.

Hereinafter, various illumination devices and daylight are compared with each other in terms of color rendering.

FIGS. 8A to 8F are graphs depicting color rendering of various illumination devices and daylight.

Figure 8A:
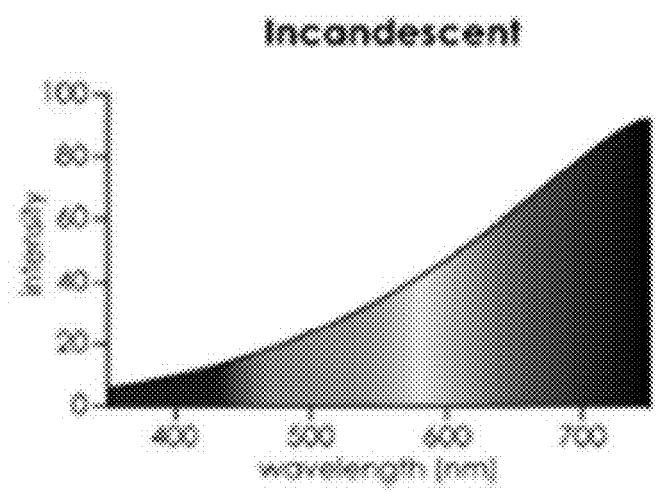
FIGS. 8A to 8F are graphs depicting color rendering of various illumination devices and daylight.
Figure 8B:
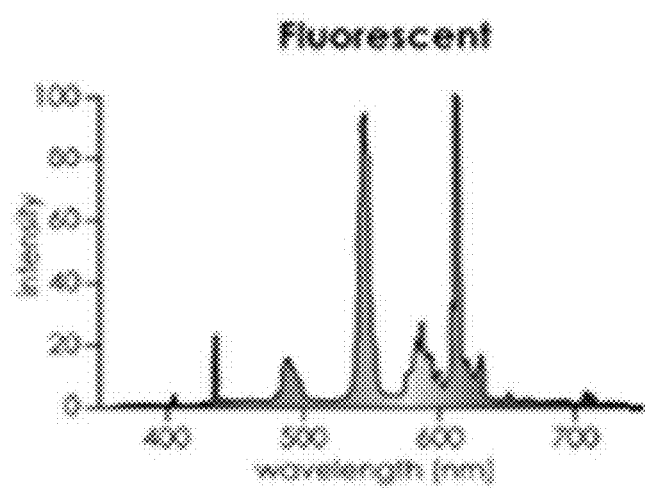
Figure 8C:
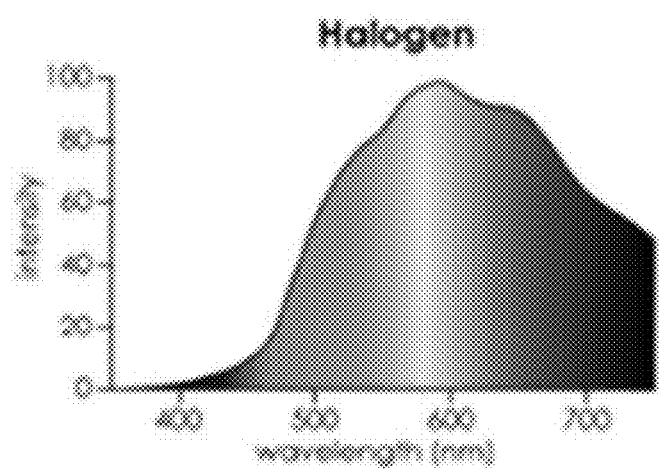
Figure 8D:
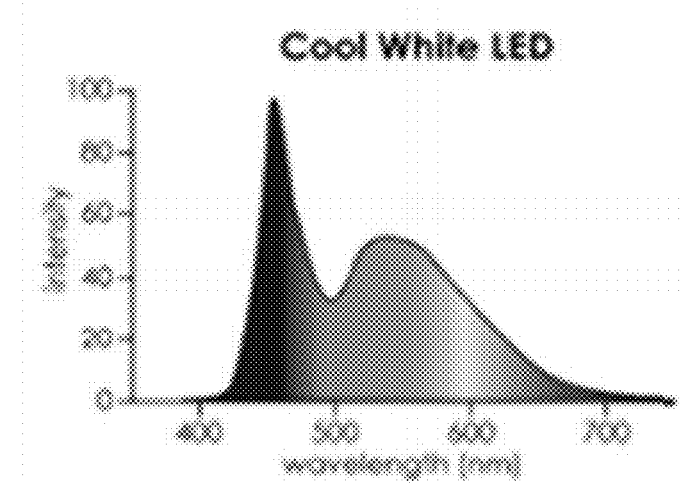
Figure 8E:
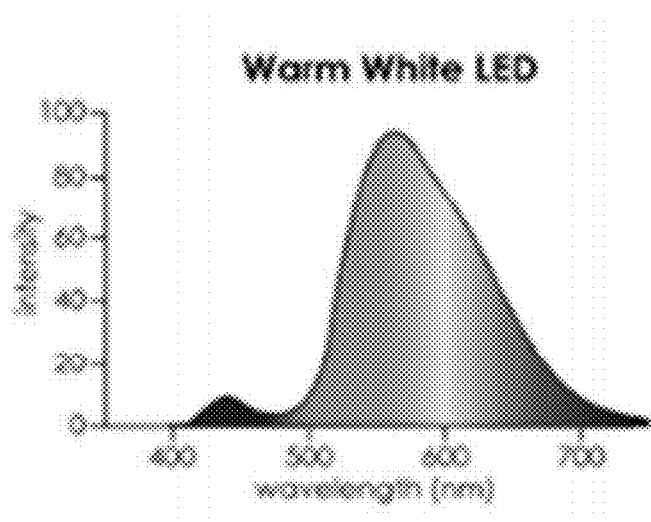
Figure 8F:
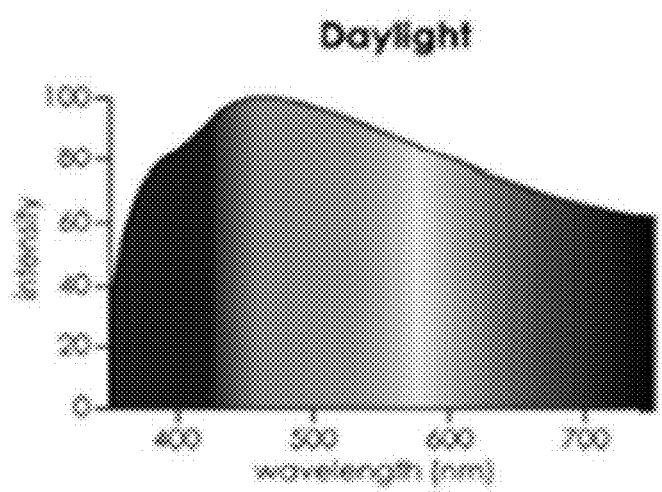

FIG. 8A shows color rendering of an incandescent bulb, which corresponds to the CRI of 50, and FIG. 8B shows color rendering of a fluorescent lamp, which corresponds to the CRI of 60. FIG. 8C shows color rendering of a halogen lamp, which corresponds to the CRI of 60. FIG. 8D shows color rendering of a cool white LED including a blue fluorescent substance, which corresponds to the CRI of about 55. FIG. 8E shows color rendering of a warm white LED, which corresponds to the CRI of about 60. FIG. 8F shows color rendering of daylight, wherein the CRI is assumed to be 100 when the intensities of daylight is given with respect to wavelengths.

That is, when the illumination device of the present disclosure is implemented, it exhibits color rendering which is closest to the daylight. In particular, when the illumination device is implemented as in the second embodiment, the most abundant color gamut of the visible light range may be obtained.

Figure 9:
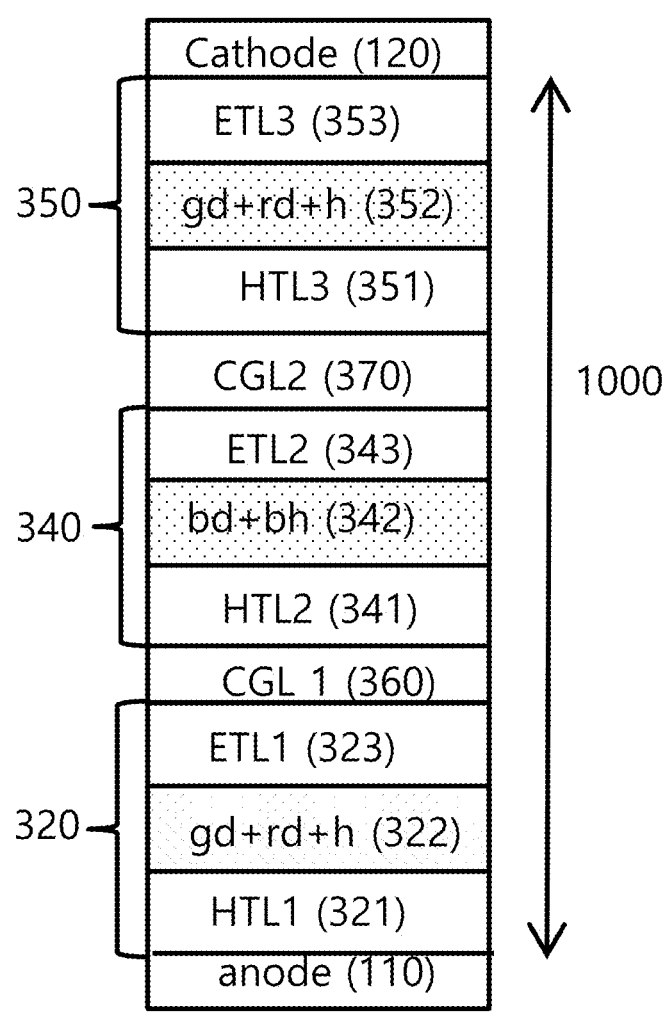
FIG. 9 is a cross-sectional view showing an illumination device according to a third embodiment of the present disclosure.

FIG. 9 is a cross-sectional view showing an illumination device according to a third embodiment of the present disclosure.

As shown in FIG. 9, the illumination device according to the third embodiment of the present disclosure includes three stacks 320, 340, and 350 in the organic stack 1000. Like the first embodiment of FIG. 1 having the first stack 130, the charge generation layer 150, and the second stack 140, the illumination device of this embodiment includes a second stack 340 including a second light emitting layer (bd+bh) 342 for emission of blue light, a third stack 350 including a third light emitting layer (gd+rd+h) 352 containing a red dopant rd and a green dopant gd, and a second charge generation layer (CGL2) 370 interposed therebetween. The illumination device further includes a first stack 320 having a first light emitting layer (gd+rd+h) 322 including a red dopant rd and a green dopant gd and a first charge generation layer (CGL1) 360 interposed between the first stack 320 and the second stack 340. The first stack 320 has the same structure as the third stack 350. A hole transport layer (HTL1) 321, a hole transport layer (HTL2) 341, and a hole transport layer (HTL3) 351 and a first electron transport layer (ETL1) 323, an electron transport layer (ETL2) 343, and an electron transport layer (ETL3) 353 are arranged under and on each of the light emitting layers in the same manner.

Figure 10:
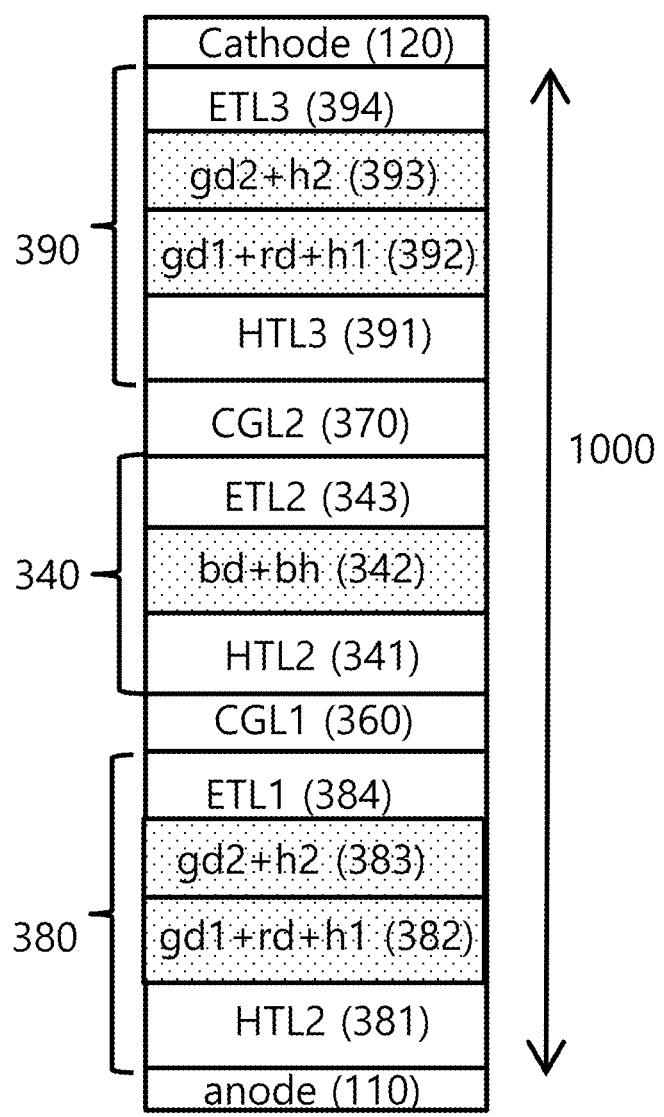
FIG. 10 is a cross-sectional view showing an illumination device according to a fourth embodiment of the present disclosure.

FIG. 10 is a cross-sectional view showing an illumination device according to a fourth embodiment of the present disclosure.

FIG. 10 shows a lighting device according to the fourth embodiment of the present disclosure. When compared with the third embodiment, a second stack 340 having the blue light emitting layer bd+bh 342 has a same configuration as the second stack 340 of the third embodiment, and first and third stacks 380 and 390 have the same shape as the second stack 240 of FIG. 2 described above. That is, each of the first and third stacks 380 and 390 includes a second light emitting layer (gd1+rd+h1) 382, 392 including a second dopant gd1 for emission of green light, a third dopant rd for emission red light, and a host h1. Each of the first and third stacks 380 and 390 further includes a third light emitting layer (gd2+h2) 383, 393 contacting the second light emitting layer 382, 392 and having only a fourth dopant gd2 having a range of the green peak wavelength same as or similar to that of the second dopant gd1 as an emitter. In this case, in the first and third stacks 380 and 390, a hole transport layer (HTL1) 381 and a hole transport layer (HTL3) 391 is arranged under the respective second light emitting layer 382, 392, and an electron transport layer (ETL1) 384 and an electron transport layer (ETL2) 382 is arranged on the respective third light emitting layer 383, 393, as in the first embodiment described above. The second dopant gd1 and the fourth dopant gd2 emit the same or similar green peak wavelength. The fourth dopant gd2 may be included with a content of 6 to 15% by weight in the third light emitting layer 383, 393. As the third light emitting layers 383 and 393 are further provided, color gamut may be enhanced for the green wavelength similarly to the above-described case.

Although not shown, a plurality of blue stacks including a blue light emitting layer may be provided between the first electrode 110 and the second electrode 120. Alternatively, the second light emitting layer having a red dopant and a green dopant co-deposited and the third light emitting layer having only a green dopant as an emitter and contacting the second light emitting layer may be included in three or more stacks. The configurations described above may be selected according to the required efficiency of lighting, and the illumination devices of any embodiments of the present disclosure have the same color balance regardless of current density.

As is apparent from the above description, the illumination device of the present disclosure has the following effects.

First, as the illumination device employs a structure in which a space between first and second electrodes is filled with only the organic layer, the illumination device may be implemented without a separate package, and is also applicable to a flexible device because it is easily made to be slim.

Second, in an organic light emitting layer provided between a first electrode and a second electrode, a blue light emitting layer having lower efficiency and an energy bandgap different from that of emitters of other colors is provided in an independent stack, while emitters of green and red, which have similar energy bandgaps, are provided in the same light emitting layer in another stack through co-deposition. Thereby, the color temperature may be kept constant in a long-wavelength range regardless of change in current density.

Third, as a green light emitting layer containing only an emitter of green and directly contacting the light emitting layer including emitters of green and red is further provided, color rendering of white light emission may be enhanced. Therefore, an illumination device having a color rendering index similar to that of daylight may be implemented.

While the present disclosure has been particularly shown and described with reference to exemplary embodiments thereof, it is to be understood that the disclosure is not limited to the disclosed exemplary embodiments, but may be practiced without departing from the scope of the disclosure. It will be apparent to those skilled in the art that various modifications and variations can be made in the present disclosure without departing from the spirit and scope of the disclosure. Thus, it is intended that the present disclosure cover the modifications and variations of this disclosure provided they come within the scope of the appended claims and their equivalents.

What is claimed is:

1. An illumination device comprising a first electrode and a second electrode disposed opposite each other, and an organic stack filling a gap between the first electrode and the second electrode,
    wherein the organic stack comprises:
    a first stack disposed between the first electrode and the second electrode and having a first light emitting layer comprising a first dopant having a peak wavelength between 420 nm and 470 nm as an emitter;
    a second stack disposed between the first stack and the second electrode and having a second light emitting layer and a third light emitting layer that contacts the second light emitting layer; and
    a first charge generation layer disposed between the first stack and the second stack,
    wherein the second light emitting layer comprises, as emitters, a second dopant having a peak wavelength of 500 nm to 590 nm and a third dopant having a peak wavelength greater than the peak wavelength of the second dopant by 60 nm to 100 nm, and
    wherein the third light emitting layer has only a fourth dopant having a peak wavelength of 500 nm to 590 nm as an emitter.

2. The illumination device according to claim 1 wherein a ratio of the first dopant to a host material is between 2 to 10% by weight in the first light emitting layer.

3. The illumination device according to claim 1, wherein a ratio of the second dopant to a host material is between 4 to 15% by weight in the second light emitting layer, wherein a ratio of the third dopant to a host material is between 0.1 to 2.0% by weight in the second light emitting layer.

4. The illumination device according to claim 1, wherein a ratio of the fourth dopant to a host material is between 4 to 15% by weight in the third light emitting layer.

5. The illumination device according to claim 1, wherein the organic stack further comprises:
   a third stack disposed between the first electrode and the first stack and separated from the first stack by a second charge generation layer interposed therebetween, the third stack comprising a fourth light emitting layer identical to the second light emitting layer.

6. The illumination device according to claim 5, wherein the third stack further comprises:
   a fifth light emitting layer contacting the fourth light emitting layer and having only a fourth dopant having a peak wavelength of 500 nm to 590 nm as an emitter.

* * * * *